US006275085B1

(12) United States Patent
Mullarkey (10) Patent No.: US 6,275,085 B1
(45) Date of Patent: Aug. 14, 2001

(54) COMPARATOR FOR DETERMINING PROCESS VARIATIONS

(75) Inventor: Patrick J. Mullarkey, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/317,387

(22) Filed: May 24, 1999

(51) Int. Cl.[7] .................................................. H03H 11/26
(52) U.S. Cl. ............................................. 327/276; 327/147
(58) Field of Search ..................................... 327/147, 149, 327/150, 156, 158, 159, 161, 162, 163, 244, 276, 277; 331/11, 12

(56) References Cited

U.S. PATENT DOCUMENTS 5,815,017 * 9/1998 McFarland ............................ 327/158
5,949,260 * 9/1999 Toda ..................................... 327/149
6,044,122 * 3/2000 Ellersick et al. ..................... 375/360

* cited by examiner

Primary Examiner—Tuan T. Lam
Assistant Examiner—Linh Nguyen
(74) Attorney, Agent, or Firm—Fletcher, Yoder & Van Someren (57) ABSTRACT

A comparison circuit may be fabricated along with a primary circuit on a semiconductor substrate. The propagation delay of a comparison signal across a first path of circuit elements is compared to propagation delays of the comparison signal across a second path of delay elements. As a semiconductor fabrication process varies, the relative propagation delays across the first and second paths will vary in a manner correlative to the process variations. By monitoring the relative propagation delays, the fabrication process may be controlled to ensure that the process does not vary to an undesirable extent. Also, various programmable delay elements may be fabricated into the primary circuit, and these programmable delay elements may be activated and/or deactivated in response to the relative propagation delays of the comparison circuit.

10 Claims, 6 Drawing Sheets

COMPARATOR FOR DETERMINING PROCESS VARIATIONS

BACKGROUND OF THE INVENTION

1. Field of the Invention

The present invention relates generally to electronic circuitry and, more particularly, to a method and apparatus for comparing signal propagation delay across one circuit path with signal propagation delay across another circuit path.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs).

Each memory element in a DRAM, for instance, is paired with an access device to form a memory cell. A plurality of these memory cells are typically arranged in an array of rows and columns that are addressable by the microprocessor. Most advantageously, a memory cell resides within a memory array in such a way that information can be written to it or read from it without disturbing the other cells in the array. In the case of an exemplary DRAM, a small capacitor is coupled to an access transistor. The access transistor is coupled to a row line and a column line of the array so that it can be selectively turned on or off depending upon the voltages found on the row line and the column line. When the access transistor is turned on, information in the form of a charge may be written to or read from the capacitor.

It is desirable to create memory devices that include one or more arrays of densely packed memory cells to maximize the storage capability for a given area. As the density of memory arrays increases, the cost of the memory tends to decrease while the speed of the memory tends to increase. However, as the density of a memory, or any other semiconductor device for that matter, increases, the dimensions of the individual elements which make up the semiconductor device tend to decrease. As these dimensions become increasingly smaller, it becomes more and more difficult to fabricate the elements accurately.

To gain a better understanding of these difficulties, it may be useful to discuss the manner in which integrated circuits are formed. Integrated circuits, such as memory devices, are formed by creating microscopic electronic circuits, which are typically called microelectronic circuits, on a semiconductor wafer. Once these microelectronic circuits have been fabricated on the wafer, the circuits are typically tested, and the wafer is divided into individual die, each of which contains a similar microelectronic circuit. To complete the fabrication, appropriate metal connectors are coupled to the microelectronic circuit, and a protective package is formed around the die so that the integrated circuit may be coupled to other electronic components.

During the process of fabricating a microelectronic circuit on a wafer, a process commonly referred to as a photoresist process is repeated over and over again until the microelectronic circuit has been fully fabricated. Generally speaking, a photoresist process begins with the application of a thin layer of photoresist to the surface of the wafer. Photoresist is an organic substance that, when properly developed, resists attack by acids and solvents. This layer of photoresist is developed by placing a photographic mask, which has transparent areas and opaque areas, over the wafer. When an ultraviolet light is shined through the mask, the portion of the photoresist that is exposed to the ultraviolet light either polymerizes or depolymerizes, depending upon the type of photoresist. Depolymerized portions of the photoresist may then be removed with a suitable solvent, while polymerized portions of the photoresist remain on the surface of the wafer. The wafer is then typically baked to harden the remaining photoresist in preparation for remaining steps which form certain features of the microelectronic circuit. For instance, once the photoresist has been developed and baked, portions of the wafer exposed by the photoresist may be doped, etched, metalized, oxidized, or otherwise altered to fabricate certain desired aspects of the microelectronic circuit. Thereafter, the remaining photoresist is typically removed, using a mixture of inorganic acids or chemical-mechanical planarization, for instance. The process is repeated until all of the features of the microelectronic circuit have been fabricated.

It should be appreciated that fabrication processes of this type may be subject to many variations that may affect the microelectronic circuits being fabricated. Of course, as the size of such circuits becomes smaller, the effect of process variations on the circuits tends to become greater. For example, as the dimensions of a gate of a transistor become smaller, or as the gate oxide becomes thinner, the transistor tends to operate faster. Conversely, as gate dimensions become larger, or as the gate oxide becomes thicker, the transistor tends to operate slower. With circuit elements currently being fabricated with sub-micron dimensions, i.e., dimensions less than one millionth of a meter, process control becomes quite important in order to fabricate semiconductor chips which contain circuits that operate as designed.

As is clear from the above discussion, it takes a finite amount of time for each circuit element of a semiconductor circuit to perform its function. Thus, as signals propagate through sequential elements in the circuit, time delays are introduced along each signal path. A difference in time delays of signal propagation along different paths may cause a malfunction of a circuit that is typically referred to as a "race." Thus, in a circuit having two or more signal propagation paths that are designed to coordinate to produce a desired function, the circuit may malfunction depending on which path of gates works faster.

The present invention may address one or more of the matters mentioned above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

It would be desirable to monitor the speed of certain types of circuit elements in order to determine the manner in which process variations are affecting the overall circuit. In one exemplary embodiment disclosed in detail below, a comparison circuit may be fabricated along with a primary circuit on a semiconductor substrate. The propagation delay of a comparison signal across a first path of circuit elements is compared to propagation delays of the comparison signal across a second path of delay elements. As the semiconductor fabrication process varies, the relative propagation delays across the first and second paths will vary in a manner correlative to the process variations. By monitoring the relative propagation delays, the fabrication process may be controlled to ensure that the process does not vary to an undesirable extent. Also, various programmable delay elements may be fabricated into the primary circuit, and these programmable delay elements may be activated and/or deactivated in response to the relative propagation delays of the comparison circuit.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
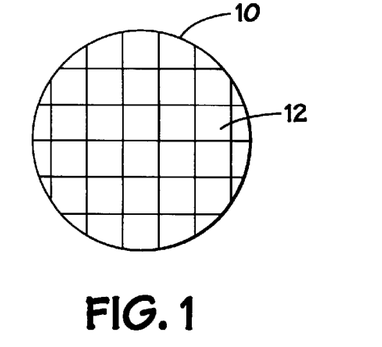
FIG. 1 illustrates a substrate, such as a semiconductor wafer, having a plurality of dies formed thereon.

Turning now to the drawings, and referring initially to FIG. 1, a substrate, such as a semiconductor wafer, is illustrated and generally designated by the reference numeral 10. The wafer has been partitioned into a plurality of die 12. Typically, use of the die 12 contains an integrated circuit that is substantially identical to the integrated circuit contained by each of the other die 12 on the wafer 10.

Figure 2:
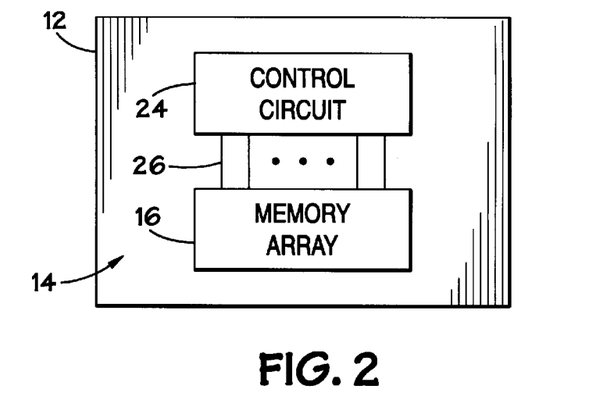
FIG. 2 illustrates an integrated circuit formed on a die of FIG. 1, where the integrated circuit includes a memory array and a control circuit.
Figure 3:
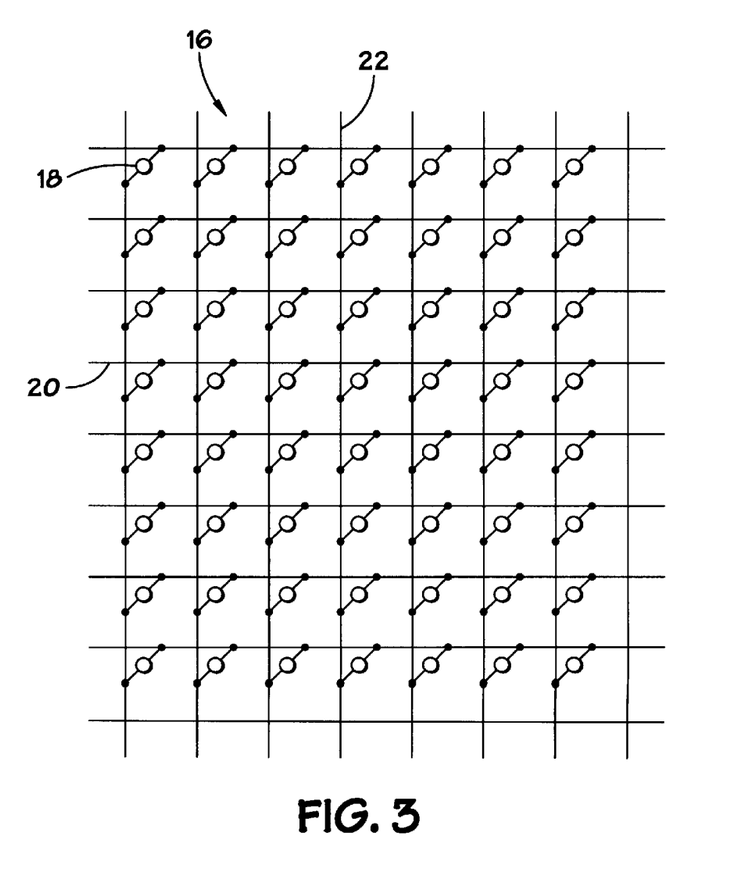
FIG. 3 illustrates an array of memory cells arranged in rows and columns.

Although a wide variety of integrated circuits may be formed on the die 12 of the wafer 10, in the embodiment illustrated in FIG. 2, a semiconductor memory device 14, such as a DRAM, is formed on the die 12. The memory device 14 generally includes a memory array 16. As illustrated in FIG. 3, the memory array 16 typically includes a plurality of memory cells 18 that are arranged in multiple rows and multiple columns. Each of the memory cells 18 is coupled to a respective row line 20 and to a respective column line 22. The memory device 14 also includes a control circuit 24 that is coupled to the memory array via one or more control lines 26. The control circuit 24 facilitates the addressing or selection of one or more of the memory cells 18 within the memory array so that information can be stored in and read from the memory cells 18.

Other than the capacitors used in the memory cells 18, transistors are the primary circuit elements that are used to create the various circuits of the memory device 14. For example, transistors are primarily used to create the address decoders, registers, sense amplifiers, and other circuits that function as part of the memory device 14. As mentioned previously, process variations may affect the speed at which these transistors operate. Due to this circumstance, delay elements may be placed in various circuit paths, typically through the use of a delay circuit. After process changes have occurred and the fabricated circuit is tested, the delay circuit may be redesigned, usually through the use of an upper level metal mask, to alter the delays in various circuit paths to adjust the speed of the various paths in view of the process changes.

As can be appreciated, this technique does not directly monitor the effect of process changes on the speed of the transistors, as it requires a relatively high level functional test of the fabricated circuit. Furthermore, this technique typically requires that a part malfunction during testing before the delay circuit is changed so that subsequently fabricated parts will function properly. Accordingly, the malfunctioning parts must be scrapped, thus reducing yield. In addition, process variations may not affect delay elements in the same manner that the process variations affect transistor speed. Therefore, the delay circuit may need to be redesigned more than once before properly functioning circuits are fabricated, thus reducing yield further.

Figure 4:
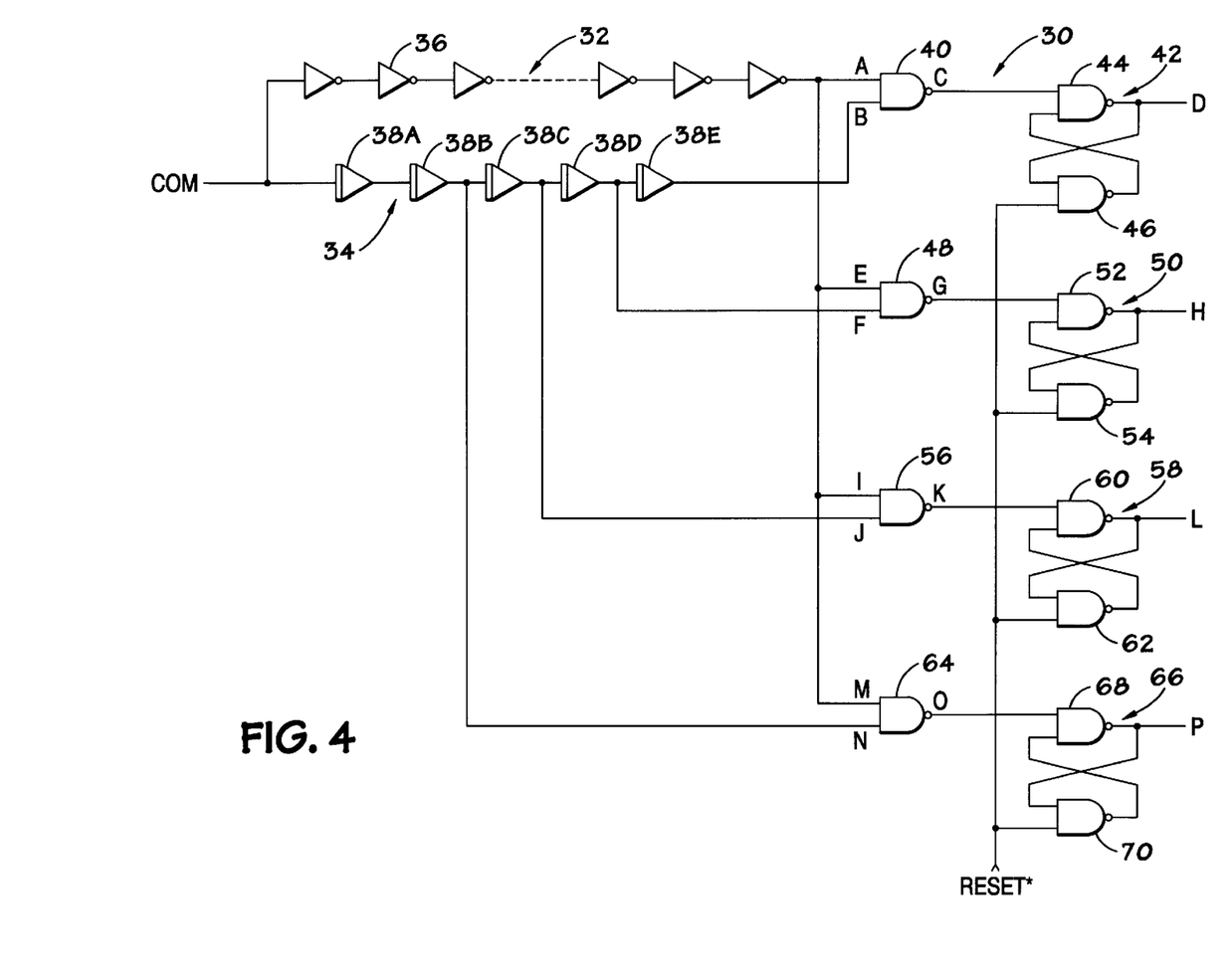
FIG. 4 illustrates a delay element versus gate count comparator circuit.

To address these problems, a circuit, such as the comparator circuit 30 illustrated in FIG. 4, may be implemented on each wafer or on each die. In the illustrated embodiment, the comparator circuit 30 compares the time for a signal to propagate along a first path 32 having a first type of circuit elements to the time for the same signal to propagate along a second path 34 having a second type of circuit elements. As illustrated, the first path 32 includes a number of inverters 36, while the second path 34 includes a number of delay elements 38.

For the purposes of this example, the first path 32 includes twenty-one inverters 36, where the signal propagation time along the first path 32 of the twenty-one inverters 36 should take between about 4 nanoseconds and about 6 nanoseconds (nominally about 5 nanoseconds), depending upon process variations. The second path 34 advantageously includes delay elements that will typically produce a delay within the range of propagation, e.g., 4 to 6 nanoseconds, of the first path 32. In this example, the second path 34 includes five delay elements 38, where the propagation delay across each delay element 38 is approximately 1 nanosecond, so that the second path 34 has a propagation delay approximately equal to the nominal propagation delay of the first path 32.

Figure 5:
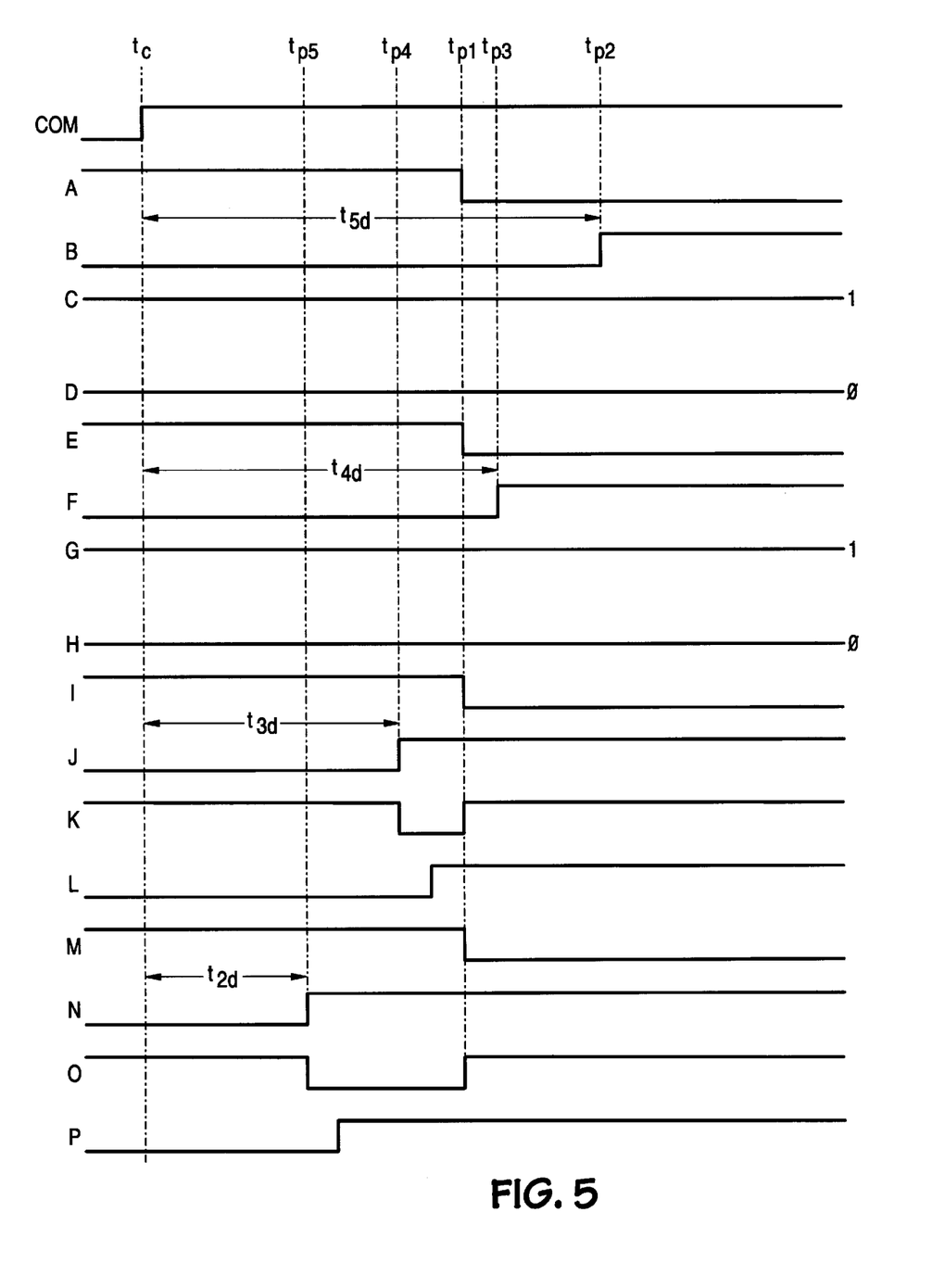
FIG. 5 illustrates various wave forms produced by the comparator illustrated in FIG. 4.

Each of the sequentially connected paths 32 and 34 of circuit elements 36 and 38 are coupled to receive a compare signal COM. As illustrated in FIG. 5, the compare signal COM transitions from a logical zero to a logical one at time $t_c$. Due to the odd number of inverters in the first path 32, the signal at node A transitions from a logical one to a logical zero at time $t_{p1}$. Thus, the difference between the time $t_c$ when the compare signal COM was initiated and the time $t_{p1}$ represents the time it took for the compare signal COM to propagate along the twenty-one inverters 36 in the first path 32.

Referring now to the second path 34, it should be noted that the signal at node B transitions from a logical zero to a logical one at time $t_{p2}$. The difference between the time $t_c$ when the compare signal COM was initiated and the time $t_{p2}$ represents the time $t_{5d}$ for the compare signal COM to propagate along the five delay elements 38 in the second path 34. As can be seen in this example, the compare signal COM propagates along the first path 32 of inverters 36 faster than along the second path 34 of delay elements 38, thus indicating that the process variations are such that the inverters 36 are operating faster than their nominal speed.

To compare the respective speeds of the two paths 32 and 34, the nodes A and B are coupled to the inputs of a NAND gate 40 which delivers its output on a node C. As illustrated in FIG. 5, the output on the node C remains at a logical one, thus indicating that the inputs on nodes A and B are never both at a logical one at the same time. In other words, the output of the NAND gate 40 on the node C indicates that the propagation delay through the inverters 36 on the first path 32 is less than the propagation delay through the delay elements 38 on the second path 34, thus indicating that the speed through the gates exceeds the speed through the delay elements. The output of the NAND gate 40 is coupled to the set input of a latch 42 formed by cross-coupled NAND gates 44 and 46. The output of the latch 42 on the node D essentially captures the compliment of the signal on the node C so that the result of this test or operation may be temporarily saved for further use, as described below with reference to FIG. 6.

It should be noted that delay signals may be tapped at different points between the delay elements 38 on the second path 34 to create several output signals that may be used to determine the effect that process variations have had on the speed of the inverters 36 to a greater degree. In this example, three taps are illustrated—a first at a node F between the fourth delay element 38D and the fifth delay element 38E, a second at a node J between the third delay element 38C and the fourth delay element 38D, and a third at a node N between the second delay element 38B and the third delay element 38C.

The output of the first tap on the node F is delivered to the input of a NAND gate 48, while the output of the first path 32 of inverters 36 at node A is coupled to the other input of the NAND gate 48 at the node E. As illustrated in FIG. 5, the signals on the nodes A and E are identical, while the signal at the node F transitions from a logical zero to a logical one at a time $t_{p3}$, which is one delay sooner than the signal on the node B. Thus, the difference between the time $t_c$ when the compare signal COM was initiated and the time $t_{p3}$ represents the time $t_{4d}$ of signal propagation across the four delay elements 38A–D. Because the signal on the node F does not change state before the signal on the node E, the compare signal COM still propagates faster through the twenty-one inverters 36 in the first path 32 than through the four delay elements 38A–D in the second path 34. Thus, the output of the NAND gate 48 on the node G remains at a logical one to indicate this situation, and the output on node H of the second latch 50 formed by the cross-coupled NAND gates 52 and 54 delivers the compliment of the signal on the node G.

The output of the second tap on the node J is delivered to the input of a NAND gate 56, while the output of the first path 32 of inverters 36 at node A is coupled to the other input of the NAND gate 56 at the node I. As illustrated in FIG. 5, the signals on the nodes A and I are identical, while the signal at the node J transitions from a logical zero to a logical one at a time $t_{p4}$, which is two delays sooner than the signal on the node B. Thus, the difference between the time $t_c$ when the compare signal COM was initiated and the time $t_{p4}$ represents the time delay $t_{3d}$ of the three delay elements 38A–C. Because the signal on the node J changes state before the signal on the node I, the compare signal COM propagates slower through the twenty one inverters 36 in the first path 32 than through the three delay elements 38A–C in the second path 34. Thus, the output of the NAND gate 56 on the node K transitions from a logical one to a logical zero at time $t_{p4}$ to indicate the situation, and the output on node L of the third latch 58 formed by the cross-coupled NAND gates 60 and 62 captures the compliment of the signal on the node K after a short delay.

Similarly, the output of the third tap on the node N is delivered to the input of a NAND gate 64, while the output of the first path 32 of inverters 36 at node A is coupled to the other input of the NAND gate 64 at the node M. As illustrated in FIG. 5, the signals on the nodes A and M are identical, while the signal at the node N transitions from a logical zero to a logical one at a time $t_{p5}$, which is three delays sooner than the signal on the node B. Thus, the difference between the time $t_c$ when the compare signal COM was initiated and the time $t_{p5}$ represents the time delay $t_{2d}$ of the two delay elements 38A–B. Because the signal on the node N changes state before the signal on the node M, the compare signal COM propagates slower through the twenty-one inverters 36 in the first path 32 than through the two delay elements 38A–B in the second path 34. Thus, the output of the NAND gate 64 on the node O transitions from a logical one to a logical zero at time $t_{p5}$ to indicate the situation, and the output on node P of the second latch 66 formed by the cross-coupled NAND gates 68 and 70 delivers the compliment of the signal on the node O.

Figure 6:
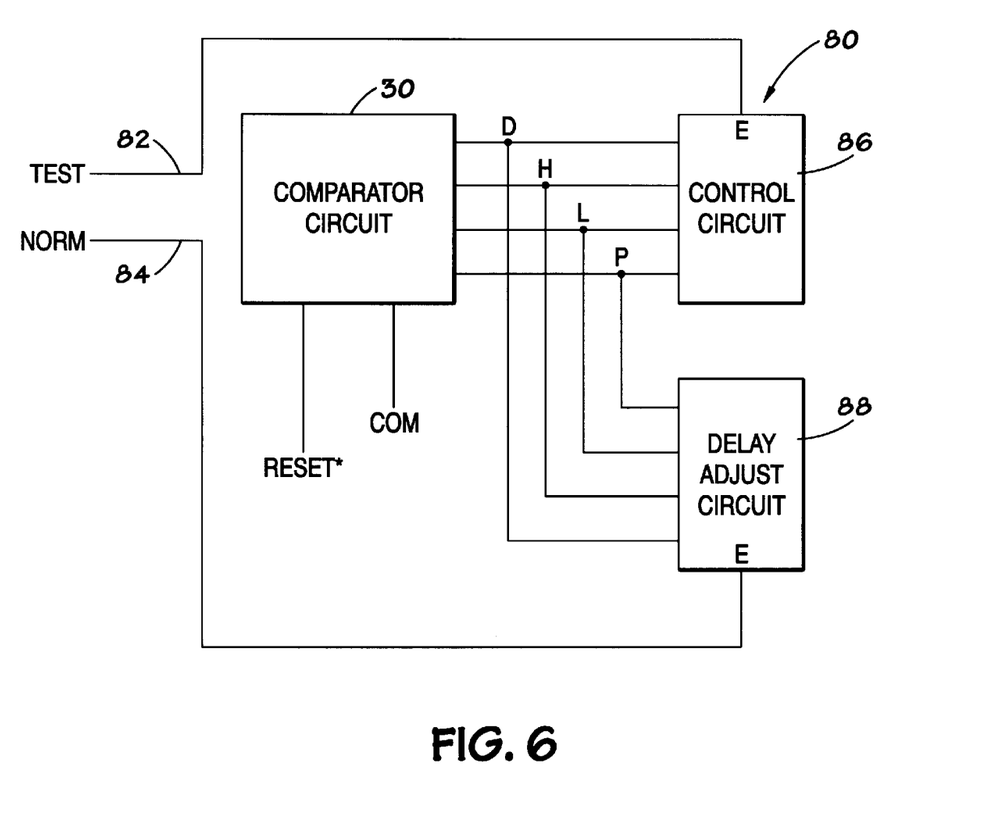
FIG. 6 illustrates a block diagram of a circuit that includes the comparator of FIG. 4 or FIG. 7 for use in a test mode for a normal mode.

A circuit may read the outputs of the latches on the nodes D, H, L, and P to determine the relative speed of the paths 32 and 34 and, thus, the extent that the process variations have affected the fabricated circuitry. For example, as illustrated in FIG. 6 by the circuit 80, the outputs of the latches on the nodes D, H, L, and P may be used in a test mode and/or in normal operation of the fabricated circuit. The comparator circuit 30 is coupled to receive a test mode signal TEST on a line 82 and a normal operation signal NORM on a line 84. The nodes D, H, L, and P of the comparator circuit 30 are coupled to a DQ circuit 86 and to a delay adjust circuit 88. The line 82 is coupled to the enable input of the DQ circuit 86, and the line 84 is coupled to the enable input of the delay adjust circuit 88.

To initiate the test mode, the test mode signal TEST is asserted on the line 82, while the normal operation signal NORM on the line 84 remains unasserted. Thus, when the compare signal COM is asserted, the outputs on the nodes D, H, L, and P are delivered to the DQ circuit 86 which has been enabled by the test mode signal TEST. The DQ circuit 86 may then easily be read by providing an output of the logic values of the nodes D, H, L, and P on one or more of the DQ circuit's output pins. The state of the signals on the nodes D, H, L, and P may be used to determine how well the delay elements compare to the normal gate delay as the fabrication process varies. This information may be used to help control process variations, as well as to help designers design better delay elements.

The comparator circuit 30 may also be used in a normal operational mode. As discussed previously, delay elements are typically formed in various locations in a circuit using a delay circuit which can be adjusted with one or more masks. To add or remove a delay element, the delay circuit is changed and a new circuit is fabricated. However, as set forth in FIG. 6, the output signals of the comparator circuit 30 on the nodes D, H, L, and P may be used to add or remove delay elements in a different manner. For example, the circuits on the dice 12 may be fabricated with a number of delay elements which may be placed in service and/or removed from service in response to receiving an appropriate signal. By coupling the nodes D, H, L, and P to the inputs of a delay adjust circuit 88, for example, the outputs of delay adjust circuit 88 may be used to option delay elements in or out of the operation within the circuit.

Figure 7:
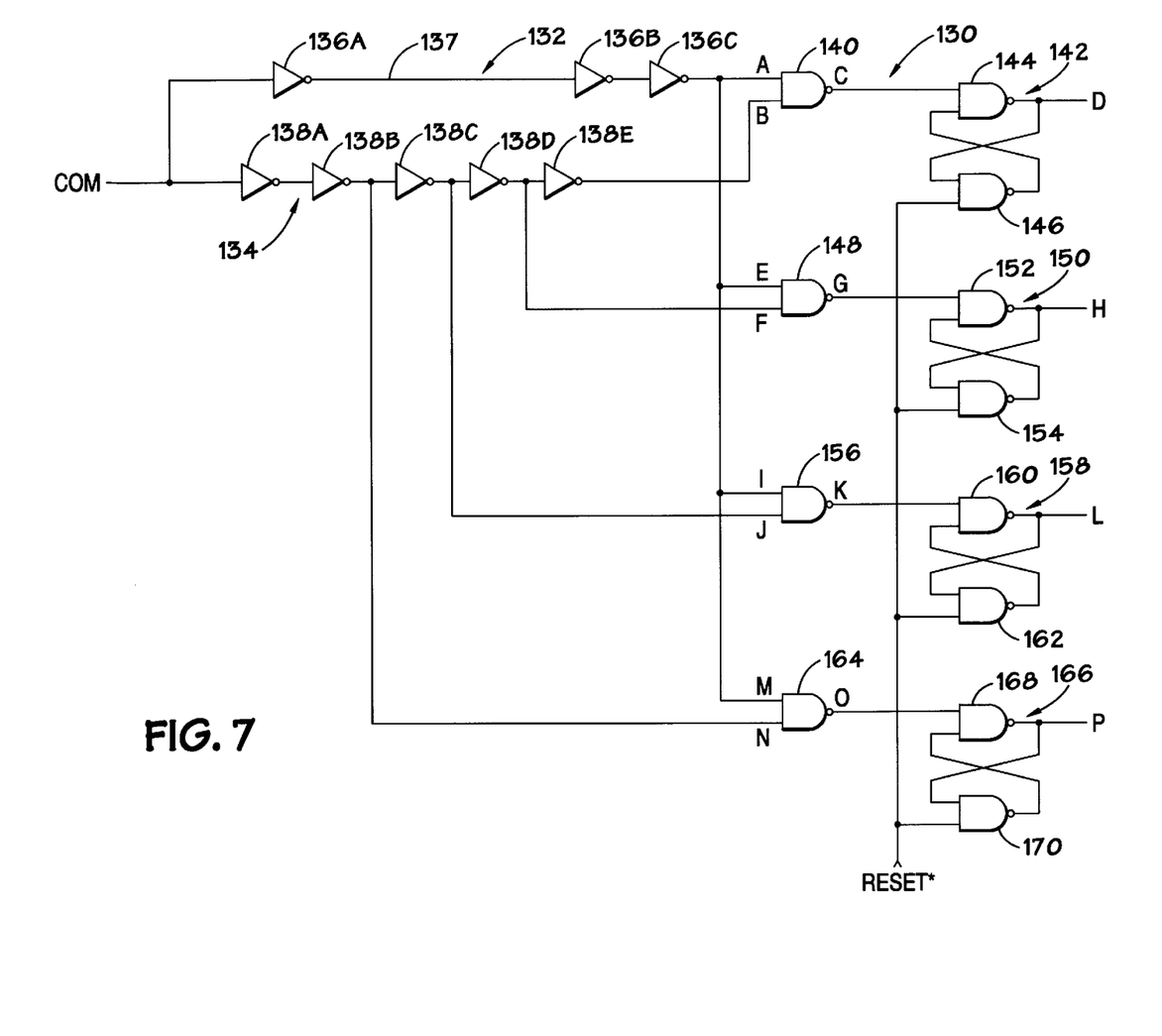
FIG. 7 illustrates a line versus gate count comparator circuit.

The comparator circuit 30 has been described above to demonstrate the manner in which the comparison of propagation delays across a series of inverters 36 and across a series of delay elements 38 may be used to determine the extent of process variations. However, as indicated above, other types of circuit paths may also be used to determine the extent of process variations. For example, as illustrated in FIG. 7, a circuit, such as the comparator circuit 130 may be implemented on each wafer or on each die. In the illustrated embodiment, the comparator circuit 130 compares the time for a signal to propagate along a first path 132 to the time for the same signal to propagate along a second path 134. As illustrated, the first path 132 includes three inverters 136A–C and a long conductive line 137, which may be metal or polysilicon for instance, while the second path 134 includes a number of inverters 138A–E.

For the purposes of this example, the first path 132 has a signal propagation time of about 1 to 1.5 nanoseconds nominally, depending upon process variations. The second path 134 advantageously includes inverters 138 that will typically produce a nominal delay within the range of propagation, e.g., about 1.25 nanoseconds, of the first path 132. Thus, in this example, the second path 134 includes five inverters 138A–E, where the propagation delay across each inverter 138 is approximately 250 picoseconds, so that the second path 134 has a nominal propagation delay approximately equal to the nominal propagation delay of the first path 132.

Figure 8:
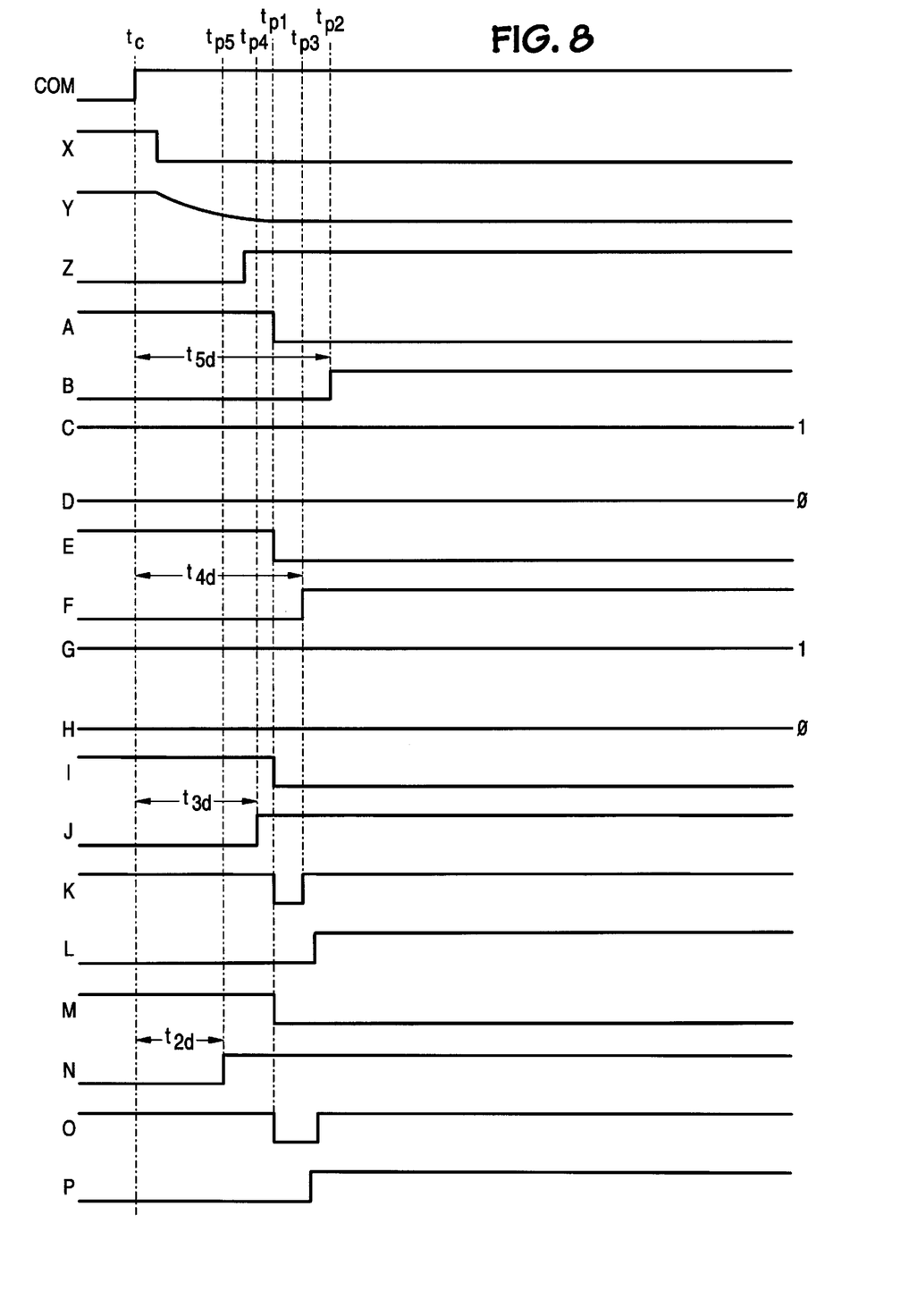
FIG. 8 illustrates various wave forms produced by the comparator illustrated in FIG. 7.

Each of the paths 132 and 134 are coupled to receive a compare signal COM. As illustrated in FIG. 8, the compare signal COM transitions from a logical zero to a logical one at time $t_c$. Shortly thereafter, the signal X at the output of the inverter 136A transitions from a logical one to a logical zero. Due to the resistance and the parasitic capacitance of the line 137, the signal Y at the input of the inverter 136B drops slowly in accordance with the RC time constant of the line 137. When the signal Y reaches the trip point for the inverter 136B, the output of the inverter 136B transitions from a logical zero to a logical one, as illustrated by the signal Z in FIG. 8.

Due to the odd number of inverters in the first path 132, the signal at node A transitions from a logical one to a logical zero at time $t_{p1}$. Thus, the difference between the time $t_c$ when the compare signal COM was initiated and the time $t_{p1}$ represents the time it took for the compare signal COM to propagate along the three inverters 136A–C in the first path 132.

Referring now to the second path 134, it should be noted that the signal at node B transitions from a logical zero to a logical one at time $t_{p2}$. The difference between the time $t_c$ when the compare signal COM was initiated and the time $t_{p2}$ represents the time $t_{5d}$ for the compare signal COM to propagate along the five inverters 138A–E in the second path 134. As can be seen in this example, the compare signal COM propagates along the first path 132 faster than along the second path 34, thus indicating that the process variations are such that the inverters 136 and the line 137 are operating faster than their nominal speed.

To compare the respective speeds of the two paths 132 and 134, the nodes A and B are coupled to the inputs of a NAND gate 140 which delivers its output on a node C. As illustrated in FIG. 8, the output on the node C remains at a logical one, thus indicating that the inputs on nodes A and B are never both at a logical one at the same time. In other words, the output of the NAND gate 140 on the node C indicates that the propagation delay through the first path 132 is less than the propagation delay through the second path 134, thus indicating that the speed through the inverters 136 and the line 137 exceeds the speed through the inverters 138. The output of the NAND gate 140 is coupled to the set input of a latch 142 formed by cross-coupled NAND gates 144 and 146. The output of the latch 142 on the node D essentially captures the compliment of the signal on the node C so that the result of this test or operation may be temporarily saved for further use, as described above with reference to FIG. 6.

It should be noted that delay signals may be tapped at different points between the inverters 138 on the second path 134 to create several output signals that may be used to determine the effect that process variations have had on the speed of the line 137 to a greater degree. In this example, three taps are illustrated—a first at a node F between the fourth inverter 138D and the fifth inverter 138E, a second at a node J between the third inverter 138C and the fourth inverter 138D, and a third at a node N between the second inverter 138B and the third inverter 138C.

The output of the first tap on the node F is delivered to the input of a NAND gate 148, while the output of the first path 132 at node A is coupled to the other input of the NAND gate 148 at the node E. As illustrated in FIG. 8, the signals on the nodes A and E are identical, while the signal at the node F transitions from a logical zero to a logical one at a time $t_{p3}$, which is one inverter delay sooner than the signal on the node B. Thus, the difference between the time $t_c$ when the compare signal COM was initiated and the time $t_{p3}$ represents the time $t_{4d}$ of signal propagation across the four inverters 138A–D. Because the signal on the node F does not change state before the signal on the node E, the compare signal COM still propagates faster through the three inverters 136 and the line 137 in the first path 32 than through the four inverters 138A–D in the second path 134. Thus, the output of the NAND gate 148 on the node G remains at a logical one to indicate this situation, and the output on node H of the second latch 150 formed by the cross-coupled NAND gates 152 and 154 delivers the compliment of the signal on the node G.

The output of the second tap on the node J is delivered to the input of a NAND gate 156, while the output of the first path 132 at node A is coupled to the other input of the NAND gate 156 at the node I. As illustrated in FIG. 8, the signals on the nodes A and I are identical, while the signal at the node J transitions from a logical zero to a logical one at a time $t_{p4}$, which is two inverter delays sooner than the signal on the node B. Thus, the difference between the time $t_c$ when the compare signal COM was initiated and the time $t_{p4}$ represents the time delay $t_{3d}$ of the three inverters 138A–C. Because the signal on the node J changes state before the signal on the node I, the compare signal COM propagates slower through the first path 132 than through the three inverters 138A–C in the second path 134. Thus, the output of the NAND gate 156 on the node K transitions from a logical one to a logical zero at time $t_{p4}$ to indicate the situation, and the output on node L of the third latch 158 formed by the cross-coupled NAND gates 160 and 162 captures the compliment of the signal on the node K after a short delay.

Similarly, the output of the third tap on the node N is delivered to the input of a NAND gate 164, while the output of the first path 132 at node A is coupled to the other input of the NAND gate 164 at the node M. As illustrated in FIG. 8, the signals on the nodes A and M are identical, while the signal at the node N transitions from a logical zero to a logical one at a time $t_{p5}$, which is three inverter delays sooner than the signal on the node B. Thus, the difference between the time $t_c$ when the compare signal COM was initiated and the time $t_{p5}$ represents the time delay $t_{2d}$ of the two inverters 138A–B. Because the signal on the node N changes state before the signal on the node M, the compare signal COM propagates slower through the first path 132 than through the two inverters 138A–B in the second path 134. Thus, the output of the NAND gate 164 on the node O transitions from a logical one to a logical zero at time $t_{p5}$ to indicate the situation, and the output on node P of the second latch 166 formed by the cross-coupled NAND gates 168 and 170 delivers the compliment of the signal on the node O.

As discussed previously, the circuit 80 illustrated in FIG. 6 may read the outputs of the latches on the nodes D, H, L, and P to determine the relative speed of the paths 132 and 134 and, thus, the extent that the process variations have affected the fabricated circuitry.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of accessing processing variations of a semiconductor fabrication process, the method comprising the acts of:

(a) providing a first path of a first plurality of serially-coupled circuit elements, the first path having an input and an output;

(b) providing a second path of a second plurality of serially-coupled delay elements, the second path having an input and a plurality of outputs;

(c) coupling the input of the first path and the input of the second path to receive a comparison signal;

(d) coupling the output of the first path to a plurality of comparators; and (e) coupling each of the plurality of outputs of the second path to a respective one of the plurality of comparators, each of the plurality of comparators delivering a respective output signal correlative to propagation speed of the comparison signal between the input of the first path and the output of the first path and between the input of the second path and each of the plurality of outputs of the second path.

2. The method, as set forth in claim 1, wherein act (a) comprises the act of providing a first plurality of serially-coupled invertors.

3. The method, as set forth in claim 1, comprising the act of coupling the respective output of each of the plurality of comparators to a respective one of a plurality of latches.

4. The method, as set forth in claim 3, comprising the act of coupling the respective output of each of the plurality of latches to respective inputs of a multiplexor.

5. The method, as set forth in claim 1, comprising the act of programming delay elements in a circuit based on the outputs of the comparators.

6. The method, as set forth in claim 1, comprising the act of altering the processing variations based on the outputs of the comparators.

7. An apparatus for programming delay elements in an integrated circuit, the apparatus comprising:

a first path of a first plurality of serially-coupled circuit elements, the first path having an input and an output, the input of the first path being coupled to receive a comparison signal;

a second path of a second plurality of serially-coupled delay elements, the second path having an input and a plurality of outputs, the input of the second path being coupled to receive the comparison signal; and a plurality of comparators, each of the plurality of comparators having two inputs and an output, the output of the first path being coupled on one of the two inputs of each of the plurality of comparators, each of the plurality of outputs of the second path being respectively coupled to the other of the two inputs of each of the plurality of comparators, each of the plurality of comparators delivering a respective output signal correlative to propagation speed of the comparison signal between the input of the first path and the output of the first path and between the input of the second path and each of the plurality of outputs of the second path.

8. The apparatus, as set forth in claim 7, wherein the first plurality of serially-coupled circuit elements comprise invertors.

9. The apparatus, as set forth in claim 7, comprising a plurality of latches, each one of the plurality of latches having an input being coupled to the respective output of each of the plurality of comparators.

10. The apparatus, as set forth in claim 9, comprising a multiplexor coupled to a respective output of each of the plurality of latches.

* * * * *